(12) United States Patent
Su et al.

(10) Patent No.: US 9,905,592 B2
(45) Date of Patent: Feb. 27, 2018

(54) METHOD FOR MANUFACTURING TFT, ARRAY SUBSTRATE AND DISPLAY DEVICE

(71) Applicant: BOE Technology Group Co., Ltd., Beijing (CN)

(72) Inventors: Tongshang Su, Beijing (CN); Shengping Du, Beijing (CN); Ning Liu, Beijing (CN); Dongfang Wang, Beijing (CN); Guangcai Yuan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/221,222

(22) Filed: Jul. 27, 2016

(65) Prior Publication Data

US 2017/0221924 A1 Aug. 3, 2017

(30) Foreign Application Priority Data

Feb. 2, 2016 (CN) .......................... 2016 1 0073575

(51) Int. Cl.
*H01L 27/12* (2006.01)
*H01L 29/66* (2006.01)

(52) U.S. Cl.
CPC ........ *H01L 27/127* (2013.01); *H01L 27/1225* (2013.01); *H01L 27/1288* (2013.01); *H01L 29/66969* (2013.01)

(58) Field of Classification Search
CPC ...................... H01L 2021/775; H01L 27/1259
See application file for complete search history.

(56) References Cited

U.S. PATENT DOCUMENTS

| | | | | |
|---|---|---|---|---|
| 8,569,122 B2 * | 10/2013 | Yuan | .................... | H01L 21/0274 257/E29.151 |
| 9,117,915 B2 * | 8/2015 | Lu | ........................ | H01L 29/7869 |
| 9,171,941 B2 * | 10/2015 | Yoo | ..................... | H01L 29/7869 |
| 2012/0289006 A1 * | 11/2012 | Yuan | .................... | H01L 27/1288 438/158 |

\* cited by examiner

*Primary Examiner* — Yu-Hsi D Sun
(74) *Attorney, Agent, or Firm* — Banner & Witcoff, Ltd.

(57) ABSTRACT

A method for manufacturing a thin-film transistor (TFT), an array substrate and a display device are disclosed. The manufacturing method includes: forming a photoresist layer provided with a completely retained region, a partially-retained region and a completely removed region on a metal film by a half-tone mask process; forming a source/drain metal layer by etching the metal film under the cover of the photoresist layer; removing the photoresist layer in the partially-retained region; forming an active layer by patterning the semiconductor film; and removing residual photoresist layer.

8 Claims, 6 Drawing Sheets

_US 9,905,592 B2_

METHOD FOR MANUFACTURING TFT, ARRAY SUBSTRATE AND DISPLAY DEVICE

This application claims priority to and the benefit of Chinese Patent Application No. 201610073575.5 filed on Feb. 2, 2016, which application is incorporated herein in its entirety.

TECHNICAL FIELD

Embodiments of the present disclosure relate to a method for manufacturing a thin-film transistor (TFT), an array substrate, and a display device.

BACKGROUND

Currently, oxide TFT array substrates mainly have three types of structures: co-planar type, etch stop layer and back channel etching. Co-planar oxide TFTs are widely applied due to the characteristics of relatively simple structure, small damages to active layer, etc. However, in the manufacturing process, the active layer must be formed on a substrate provided with a gate insulating layer and a source/drain metal layer by a patterning process, which will involve the deposition process of an oxide semiconductor and a wet etching process with acid liquor. Both the processes can cause great damages to the formed source/drain metal layer.

SUMMARY

An embodiment of the present disclosure provides a method for manufacturing a thin-film transistor (TFT), comprising: forming a metal film on a substrate; forming a photoresist layer provided with a completely retained region, a partially-retained region and a completely removed region on the metal film by a half-tone mask process, in which at least partial completely retained region corresponds to an area, not overlapped with an active region setting area, in a source/drain electrode setting area, the partially-retained region corresponds to an overlapped area between the source/drain electrode setting area and the active region setting area, and the completely removed region is an area outside the completely retained region and the partially-retained region; forming a source/drain metal layer corresponding to the completely retained region and the partially-retained region by etching the metal film under the cover of the photoresist layer, in which the source/drain metal layer includes a source/drain pattern corresponding to the source/drain electrode setting area; removing the photoresist layer in the partially-retained region; forming a semiconductor film for covering the substrate, the photoresist layer and the source/drain metal layer in the case where the source/drain metal layer in the completely retained region is covered by the photoresist layer; forming an active layer by patterning the semiconductor film, in which the active layer includes an active region pattern corresponding to the active region setting area; and removing residual photoresist layer.

Another embodiment of the present disclosure provides an array substrate comprising a thin film transistor (TFT) manufactured by the above method for manufacturing a TFT.

Still another embodiment of the present disclosure provides a display device comprising the above array substrate.

Further scope of applicability of the present disclosure will become apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the following detailed description.

BRIEF DESCRIPTION OF THE DRAWINGS

For more clear understanding of the technical proposals in the embodiments of the present disclosure or the prior art, simple description will be given below to the accompanying drawings required in the description of the embodiments or the prior art. Obviously, the following accompanying drawings are only some embodiments of the present disclosure. Other accompanying drawings may also be obtained by those skilled in the art without creative efforts on the basis of the accompanying drawings.

DETAILED DESCRIPTION

For more clear understanding of the objectives, technical proposals and advantages of the embodiments of the present disclosure, clear and complete description will be given below to the technical proposals of the embodiments of the present disclosure with reference to the accompanying drawings of the embodiments of the present disclosure. Obviously, the preferred embodiments are only partial embodiments of the present disclosure but not all the embodiments. All the other embodiments obtained by those skilled in the art without creative efforts on the basis of the embodiments of the present disclosure shall fall within the scope of protection of the present disclosure.

In a method for manufacturing a co-planar TFT in which an active layer is made from indium gallium zinc oxide (IGZO), for instance, in the deposition process of IGZO, an oxidizing gas such as $O_2$ is introduced and can severely oxidize an exposed source/drain metal layer; and in the wet etching process of acid liquor, an etching liquid generally includes strong-acid substances such as $H_2SO_4$ and $HNO_3$, and the strong-acid substances can also erode the exposed source/drain metal layer.

The damages to the source/drain metal layer may result in the following problems. In one aspect, oxidization or erosion increases the resistance of the source/drain metal layer, increases the transmission delay of signal, and reduce display performance and stability of a display panel; and in another aspect, oxidization or erosion also results in a rough upper surface of the source/drain metal layer, so that indium tin oxide (ITO) deposited on the source/drain metal layer can be easily broken (particularly easily broken at connection positions of through holes), and hence adverse effects can be caused.

Figure 1:
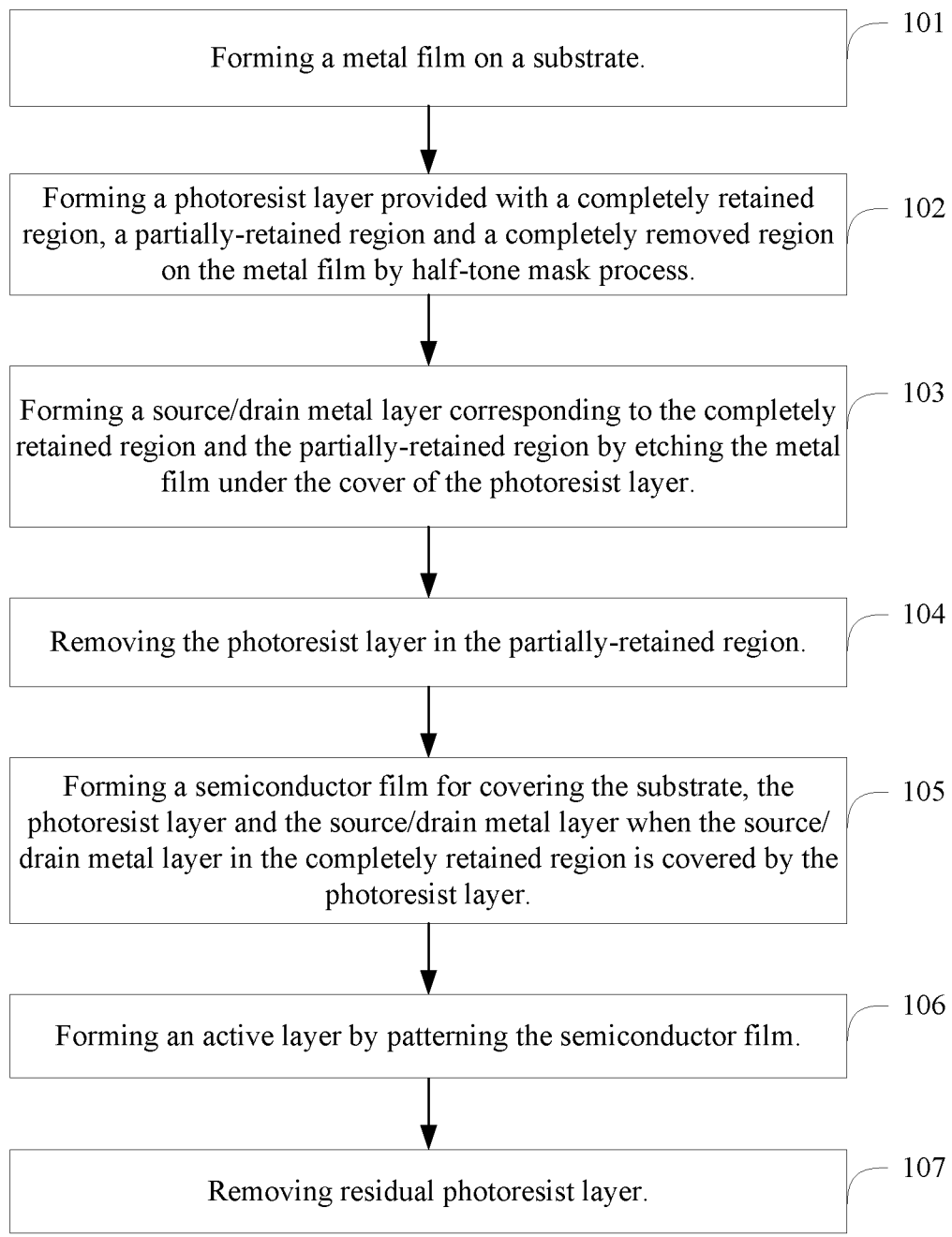
FIG. 1 is a flowchart of partial steps of a method for manufacturing a TFT provided by an embodiment of the present disclosure.

FIG. 1 is a flowchart of partial steps of a method for manufacturing a TFT provided by one embodiment of the present disclosure. As illustrated in FIG. 1, the method for manufacturing the TFT comprises the following operations.

S101: forming a metal film on a substrate.

S102: forming a photoresist layer provided with a completely retained region, a partially-retained region and a completely removed region on the metal film by a half-tone mask process, in which at least partial completely retained region corresponds to an area, not overlapped with an active region setting area, in a source/drain electrode setting area; the partially-retained region corresponds to an overlapped area between the source/drain electrode setting area and the active region setting area; the completely removed region is an area outside the completely retained region and the partially-retained region.

S103: forming a source/drain metal layer corresponding to the completely retained region and the partially-retained region by etching the metal film under the cover of the photoresist layer, in which the source/drain metal layer includes a source/drain pattern corresponding to the source/drain electrode setting area.

S104: removing the photoresist layer in the partially-retained region.

S105: forming a semiconductor film for covering the substrate, the photoresist layer and the source/drain metal layer in the case where the source/drain metal layer in the completely retained region is covered by the photoresist layer.

S106: forming an active layer by patterning the semiconductor film, in which the active layer includes an active region pattern corresponding to the active region setting area.

S107: removing residual photoresist layer.

It should be understood that the TFT in the embodiment of the present disclosure includes an active region, a gate electrode, a source electrode and a drain electrode. In the embodiment of the present disclosure, both the source electrode and the drain electrode of the TFT may be formed by the source/drain pattern in the source/drain metal layer, and arranged according to the predetermined source/drain electrode setting area, and the active region of the TFT may be formed by the active region pattern in the active layer, and arranged according to the predetermined active region setting area. Thus, it should be understood that the parameters such as position, profile shape, area, and thickness must be determined according to the parameter requirements of the TFT to be formed when the source/drain electrode setting area, the gate electrode setting area and the active region setting area are selected.

For instance, the completely retained region and the partially-retained region of the photoresist layer are photoresist patterns retained after the exposure and development of the photoresist layer. Photoresist in the completely retained region of the photoresist layer is substantially retained, and photoresist in the partially-retained region of the photoresist layer is partially retained. Alternatively, for instance, both the photoresist in the completely retained region and the photoresist in the partially-retained region are removed to a certain degree, and the thickness of the photoresist in the completely retained region is greater than that of the photoresist in the partially-retained region.

It should be noted that the substrate in the present disclosure refers to any structure required for forming the source/drain electrode pattern and the active region pattern subsequently in the method for manufacturing a TFT, may be a substrate provided without any layer structure yet, and may also be a substrate with TFTs in the intermediate state provided with some layer structures, and other structures may be further formed on this substrate after forming of the source/drain electrode pattern and the active region pattern. No limitation will be given in the embodiment of the present disclosure.

It should be understood that the metal film may be formed on a main surface of the substrate, in which the main surface refers to a surface for forming the source/drain electrode pattern and the active region pattern thereon subsequently (it may be a flat surface or a surface with height difference at various positions), for instance, a flat surface on one side of the substrate or a surface on one side of the substrate on which formed layer structures are exposed. No limitation will be given here in the embodiment of the present disclosure.

It should be also noted that both the metal film and the semiconductor film may be formed by, e.g., vapor deposition (including chemical vapor deposition (CVD), physical vapor deposition (PVD) and plasma vapor deposition), and the process of forming the source/drain electrode pattern and the process of forming the active region pattern may be respectively regarded as one patterning process (mainly including film forming and film patterning). For instance, in addition to the film forming process such as vapor deposition, the patterning process further includes the processes of forming a photoresist pattern via a mask, adopting the photoresist pattern for deposition or etching, and removing (e.g., stripping) the photoresist.

It should be understood that: in the half-tone mask process, the completely retained region, the partially-retained region and the completely removed region respectively correspond to different areas of the mask for exposure. With an appropriate exposure time period, the photoresist layer in the completely removed region may be removed; the thickness of the photoresist layer in the partially-retained region may be reduced; and the photoresist layer in the completely retained region may be substantially unchanged.

In the embodiment of the present disclosure, as the photoresist layer provided with the completely retained region, the partially-retained region and the completely removed region is formed via the half-tone mask process in the patterning process of the source/drain metal layer, the patterning process of the source/drain metal layer may be finished by metal etching in the completely removed region, and subsequently, the photoresist layer which is only arranged in the completely retained region may be formed by removing the photoresist layer in the partially-retained region. Thus, the photoresist layer in the completely retained region can protect the source/drain metal layer from being damaged in the forming process of the active layer, and the exposed photoresist layer can be removed after the patterning process of the active layer is completed, so that the subsequent steps cannot be affected.

It can be understood, the embodiment of the present disclosure can resolve the problem that the source/drain metal layer is prone to be damaged in the deposition process of the oxide semiconductor and the wet etching process of the acid liquor, does not change the original overall structure of the TFT while the number (amount) of the patterning processes is not required to be increased, and hence can improve display performance and yield of products.

As a more specific example, FIGS. 2 to 9 are schematic structural views of a TFT provided one embodiment of the present disclosure in various manufacturing processes.

Figure 2:
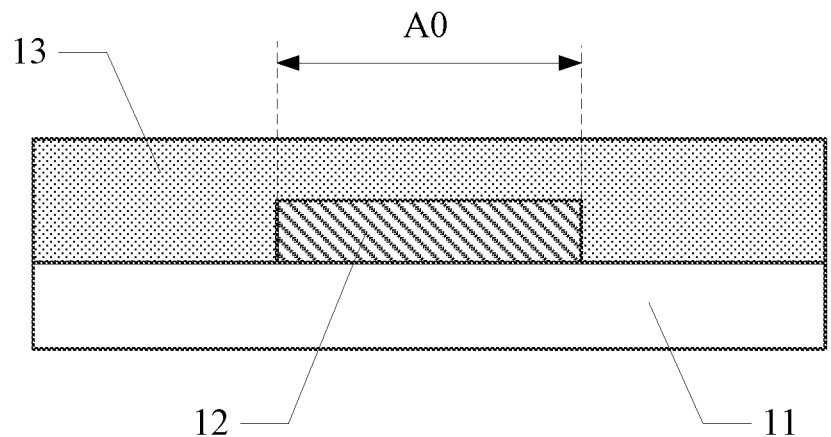
FIGS. 2 to 9 are schematic structural views of a TFT provided by an embodiment of the present disclosure in respective manufacturing processes.

The structure as illustrated in FIG. 2 corresponds to state before the step 101 for forming the TFT to be obtained in the method. At this point, the substrate includes a base 11, a gate metal layer 12 and a gate insulating layer 13 covering the base 11 and the gate metal layer 12. An exposed upper surface of the gate insulating layer 13 (namely a surface on one side away from the base 11) may be regarded as a main surface of the substrate. For instance, the structure as illustrated in FIG. 2 may be formed by the following operations not shown in the accompanying drawing:

S201: forming the gate metal layer 12 on the base 11 by one patterning process, in which the gate metal layer 12 includes a gate electrode pattern corresponding to a gate electrode setting area A0; and S202: forming the gate insulating layer 13 for covering the base 11 and the gate metal layer 12, so as to form the substrate.

It should be noted that the base 11 may be made from an inorganic material such as glass or an organic material such as polyimide and is mainly used to provide a surface for forming layer structures and support the formed layer structures; the gate metal layer 12, taken as a layer structure formed by at least one pattern, may further include other patterns such as scanning line pattern in addition to the gate electrode pattern corresponding to the gate electrode setting area A0; and the gate insulating layer 13 may be made from an insulating material such as silicon oxide or silicon nitride and is mainly used to maintain the electrical insulation between conductive structures.

It should be understood that: as the same as the above description, the steps S201 and S202 may include the processing such as deposition, exposure, development, etching and stripping. No further description will be given here. On the basis of the steps S201 and S202, a transistor having a bottom-gate structure may be formed in the embodiment of the present disclosure.

Figure 3:
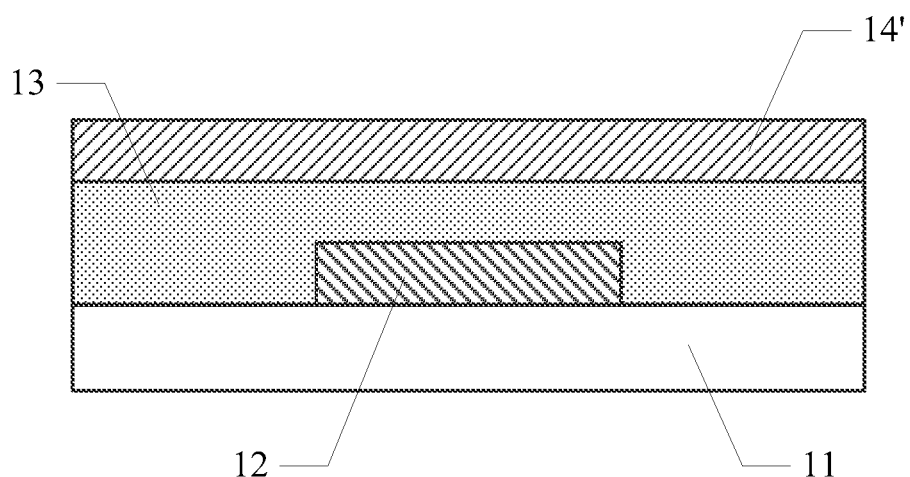

The structure as illustrated in FIG. 3 corresponds to the state after the step S101 and before the step S102 for the TFT to be obtained. As can be seen, a metal film 14' is formed on the substrate in the step S101, which may be achieved by a metal film forming process such as vapor deposition or sputtering. It should be understood that the metal film 14' is mainly used to form the source/drain electrode pattern, so the thickness of the film is in accordance with the thickness of the source/drain electrode pattern to be formed.

Figure 4:
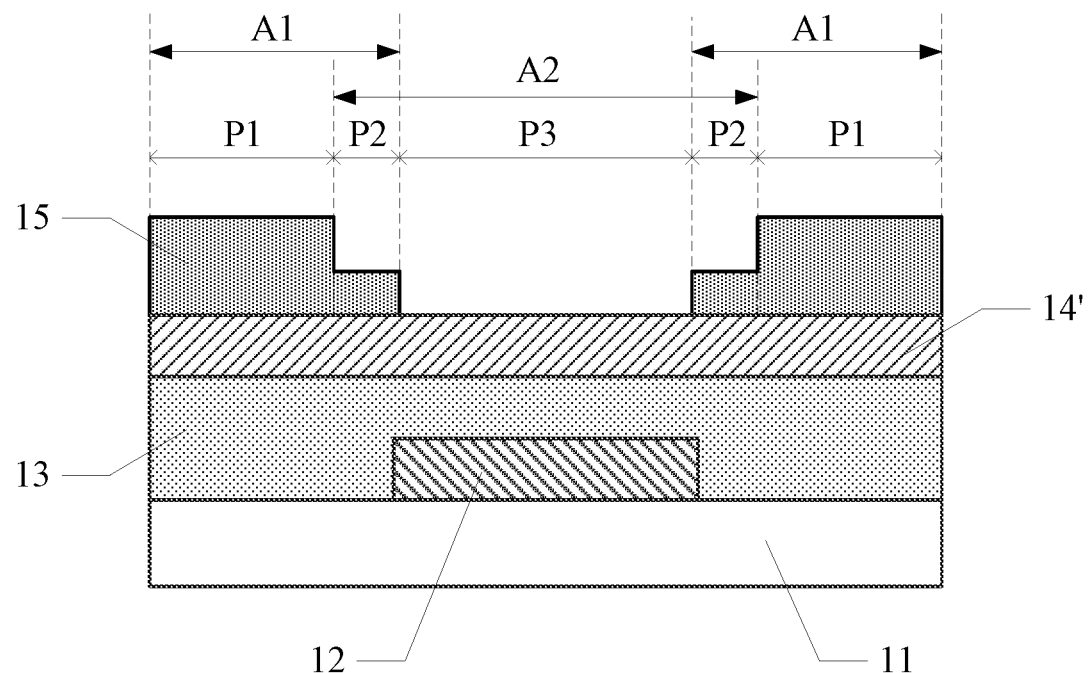

The structure as illustrated in FIG. 4 corresponds to the state after the step S102 and before the step S103 for the TFT to be obtained. More specifically, operation of forming the photoresist layer via the half-tone mask process may include the following operations.

Firstly, a layer of photoresist is formed on the entire metal film 14'; secondly, the formed photoresist is subjected to exposure via a half-tone mask; thirdly, partial photoresist is removed by development to the exposed photoresist; and finally, a photoresist layer 15 as illustrated in the drawing is formed. It should be understood that a completely light shielding pattern is formed in an area, corresponding to a completely retained region P1, of the mask; a partial light shielding pattern is formed in an area, corresponding to a partially-retained region P2, of the mask; and an area, corresponding to the completely removed region P3, of the mask is set to be transparent. Thus, with an appropriate exposure time period, the photoresist layer 15 in the completely retained region P1 can have relatively bigger first thickness; the photoresist layer 15 in the partially-retained region P2 can have relatively smaller second thickness; and the thickness of the photoresist layer 15 in the completely removed region P3 is zero.

As can be seen, partial completely retained region P1 as illustrated in the drawing corresponds to an area, not overlapped with an active region setting area A2, in a source/drain electrode setting area A1; partial partially-retained region P2 as illustrated in the drawing corresponds to an overlapped area between the active region setting area A2 and the source/drain electrode setting area A1; and the completely removed region P3 includes an area outside the completely retained region P1 and the partially-retained region P2.

It should be understood that the relationships of projections of the areas in a top view of the TFT are as follows: a portion of the projection of the source/drain electrode setting are A1, overlapped with a projection of the active region setting area A2, is included in the projection of the partially-retained area P2, and a portion of the projection of the source/drain electrode setting are A1, not overlapped with the projection of the active region setting area A2, is included in a projection of the completely retained region P1.

Figure 5:
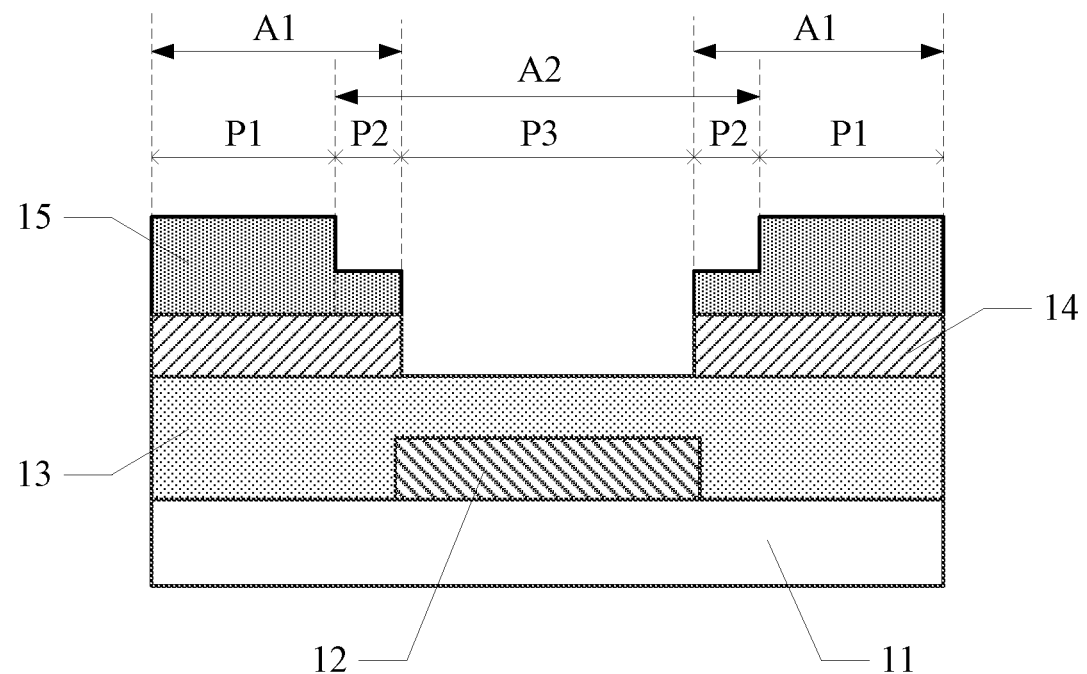

The structure as illustrated in FIG. 5 corresponds to the state after the step S103 and before the step S104 for the TFT to be obtained. As illustrated in FIG. 5, in the step S103, the metal film 14' is etched under the protection of the photoresist layer 15, and a source/drain metal layer 14 corresponding to the completely retained region P1 and the partially-retained region P2 is formed. It should be noted that the etching may be wet etching or dry etching, and the metal film 14' is patterned to form the source/drain metal layer 14 including the source/drain electrode pattern (including a source electrode and a drain electrode). The source/drain metal layer 14, taken as a layer structure formed by at least one pattern, may further includes other patterns apart from the source/drain electrode pattern corresponding to the source/drain electrode setting areas A1. For instance, when the method for manufacturing the TFT is specifically applied in a process for manufacturing an array substrate, the source/drain metal layer 14 may further include a data line pattern. In the case where the source/drain metal layer 14 includes the data line pattern, the data line pattern and the source/drain electrode pattern may be connected with each other in at least one position to form the required circuit connection relationship. When applied in the process for manufacturing the array substrate in other cases, the source/drain metal layer 14 may further include a scanning line pattern, and the scanning line pattern and a gate electrode pattern may be connected with each other via a first through hole formed in a gate insulating layer. Thus, the scanning line pattern arranged in the same layer as the source/drain electrode pattern may be formed, and hence different types of structures can be obtained and applied to different types of display devices.

It should be understood that the metal film 14' in the completely removed region P3 will be completely removed in the step S103, and the metal film 14' in the completely retained region P1 and the partially-retained region P2 will be retained in the step S103, so that the source/drain metal layer 14 can be formed. It can be seen that the completely removed region P3 may be predetermined according to the pattern of the source/drain metal layer 14 required to be formed, and the completely retained region P1 and the partially-retained region P2 may be determined as required in the areas outside the completely removed region P3.

Figure 6:
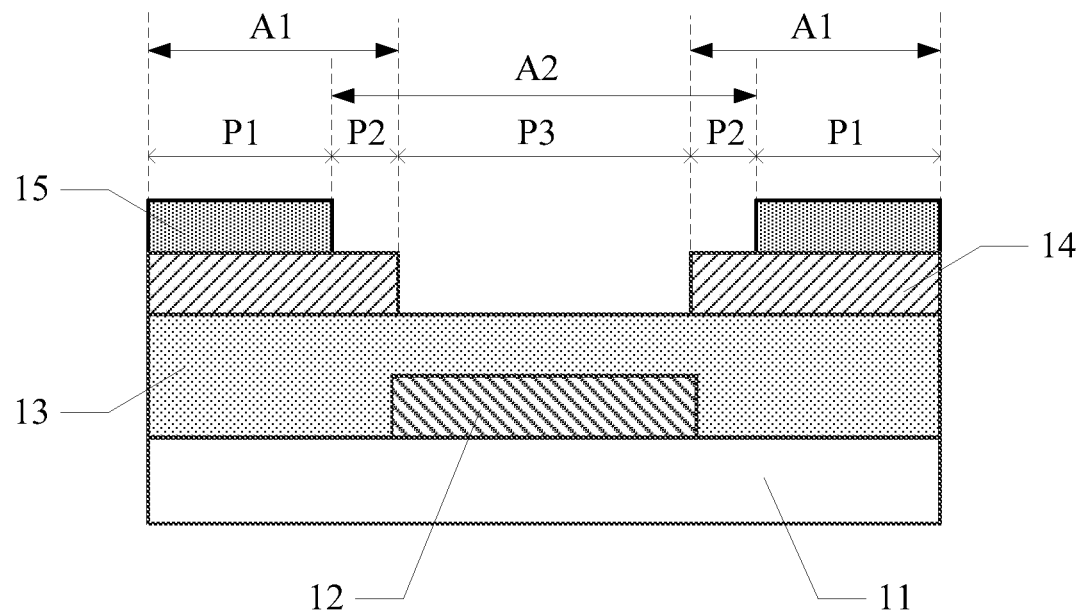

The structure as illustrated in FIG. 6 corresponds to the state after the step S104 and before the step S105 for the TFT to be obtained. In the step S104, the photoresist layer 15 in the partially-retained region P2 is removed. The adopted method may be as follows: the thickness of the photoresist layer may be entirely and uniformly reduced by the ashing process of photoresist, so as to remove the photoresist layer in the partially-retained region P2 and reduce the thickness of the photoresist layer in the completely retained region P1, and hence the photoresist layer 15 as illustrated in FIG. 6 can be formed.

Or the photoresist layer 15 may also be subjected to exposure and development via a mask applied in the halftone mask process, so as to remove the photoresist layer 15 in the partially-retained region P2 while retaining the photoresist layer in the completely retained region P1.

Of course, no matter which method is adopted to remove the photoresist layer in the partially-retained region P2, as long as the photoresist layer is still retained in the completely retained region P1, the source/drain metal layer 14 can be protected from being damaged in the process of forming the active layer with the help of the retained photoresist. No limitation will be given here in the embodiment of the present disclosure.

Figure 7:
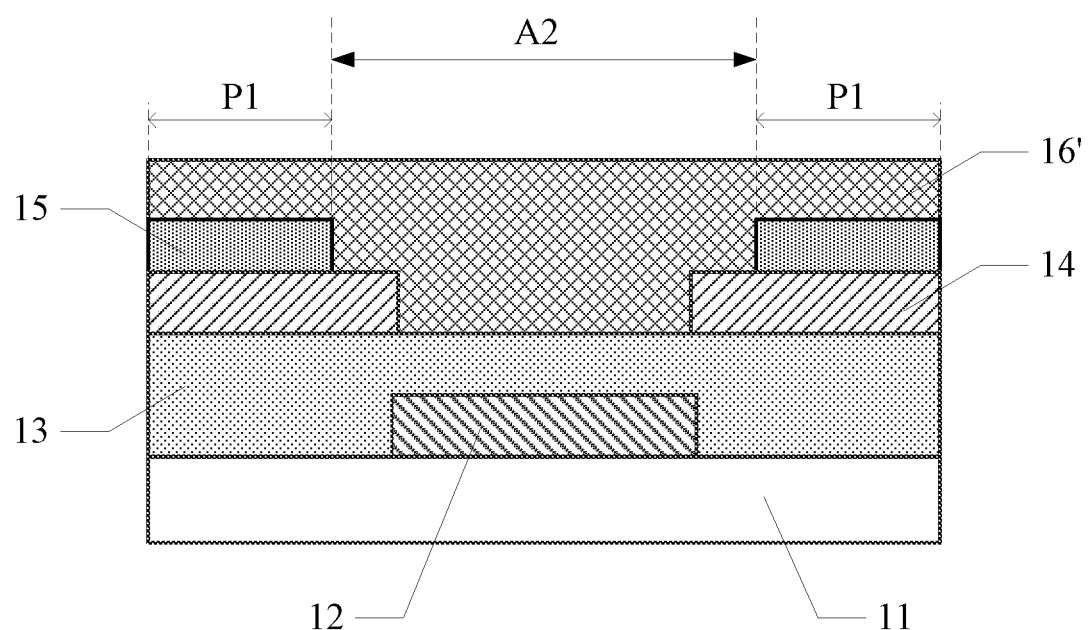
Figure 8:
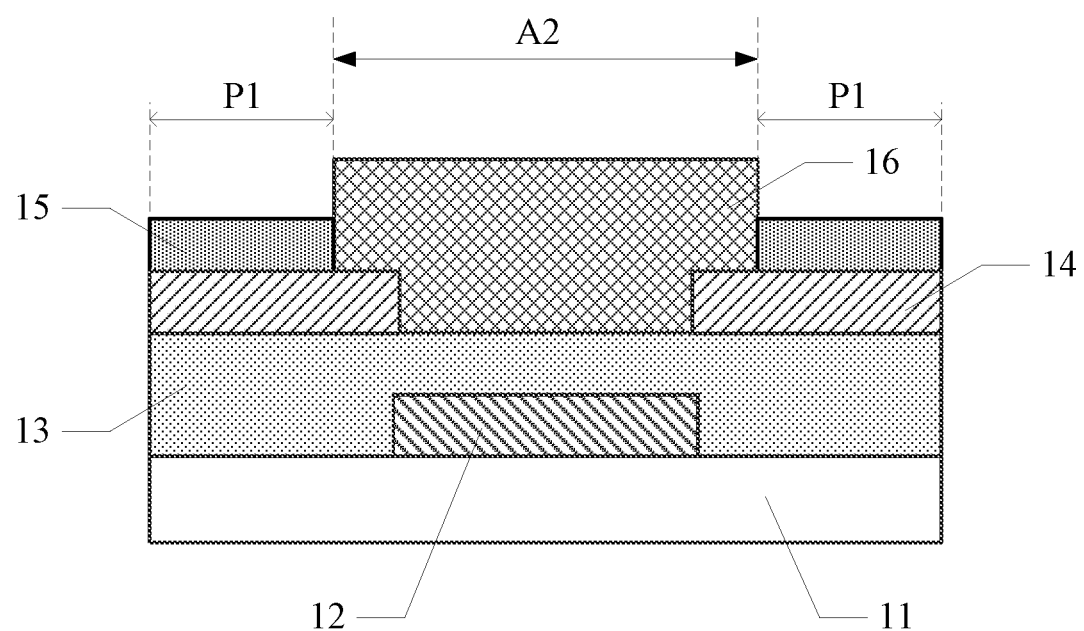

The structure as illustrated in FIG. 7 corresponds to the state after the step S105 and before the step S106 for the TFT to be obtained. The structure as illustrated in FIG. 8 corresponds to the state after the step S106 and before the step S107 for the TFT to be obtained. As illustrated in FIG. 7, a semiconductor film 16' for covering the photoresist layer 15 and the source/drain metal layer 14 is mainly formed in the step S105. As illustrated in the drawing, the semiconductor film 16' is formed over the entire surface and hence may also cover the gate insulating layer 13 formed on the substrate while covering the photoresist layer 15 and the source/drain metal layer 14. It should be noted that the forming material of the semiconductor film 16' may be determined according to the type of the adopted transistor and the device parameters.

As illustrated in FIG. 8, the semiconductor film 16' is mainly patterned in the step S106, so as to form an active layer 16 including an active region pattern corresponding to the active region setting are A2. It should be understood that the steps S105 and S106 mainly involve the forming processes of the active layer 16 and hence may be specifically conducted with reference to any patterning process for forming the active layer in the conventional process for manufacturing the transistor. No limitation will be given here in the embodiment of the present disclosure. However, it should be understood that the processes such as etching, ion implantation, oxidizing gas introduction or the like in the forming process of the active layer 16 will adversely affect metal structures exposed on the surface to some degree. But the embodiment can adopt the photoresist layer 15 disposed in the completely retained region P1 at this point to protect the source/drain metal layer 14, and hence avoid the phenomena such as surface damages and surface oxidization to the source/drain metal layer 14.

For instance, when a metal oxide TFT is adopted, in the deposition process of metal oxide semiconductor, oxidizing gas such as $O_2$ must be introduced; but under the protection of the photoresist layer, the surface of the source/drain metal layer can be prevented from being exposed in the oxidizing gas, so that the problem of increased resistance due to partial oxidization can also be avoided. It can be also seen that the forming material of the semiconductor film 16' in the embodiment of the present disclosure may include a metal oxide semiconductor, namely the manufacturing method provided by the embodiment of the present disclosure is particularly suitable for this type of TFTs.

It should be understood that the completely retained region P1 can cover the exposed surface of the source/drain metal layer to a maximum degree while completely covering the source/drain electrode setting area A1 (namely corresponding to the whole source/drain electrode setting area A1 that is not overlapped with the active region setting area A2), so that relatively better protection effect can be achieved.

However, it should be understood that the completely retained region P1 may be set to only correspond to partial area in the source/drain electrode setting area A1, which partial area is not overlapped with the active region setting area A2, and may also protect the source/drain metal layer to a certain degree. No limitation will be given here in the embodiment of the present disclosure. In a specific embodiment, after the completely retained region P1 is determined in an area outside the completely removed region P3 according to application demands, the remaining part of the area is determined as the partially-retained region P2, and the definition of the areas outside the completely removed region P3 is completed.

Figure 9:
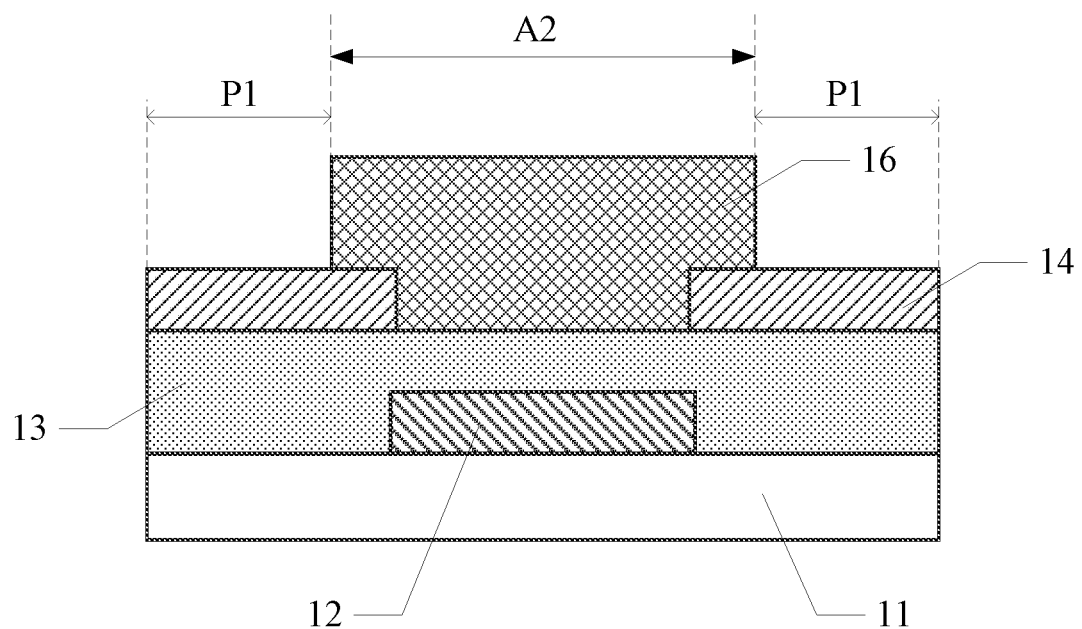

The structure as illustrated in FIG. 9 corresponds to the state after the step S107 for the TFT to be obtained. In the step S107, the residual photoresist layer 15 may be removed by, e.g., ashing or physical stripping (for instance, the residual photoresist layer 15 is removed by a stripping process via a photoresist stripper), and other necessary structures can be continuously formed on this basis. Of course, if the manufacturing process further includes the steps which can damage or oxidize the surface of the source/drain metal layer, the step S107 may be conducted after these steps, so as to further utilize the protection function of the photoresist layer 15 on the source/drain metal layer. No limitation will be given here in the embodiment of the present disclosure.

Figure 10:
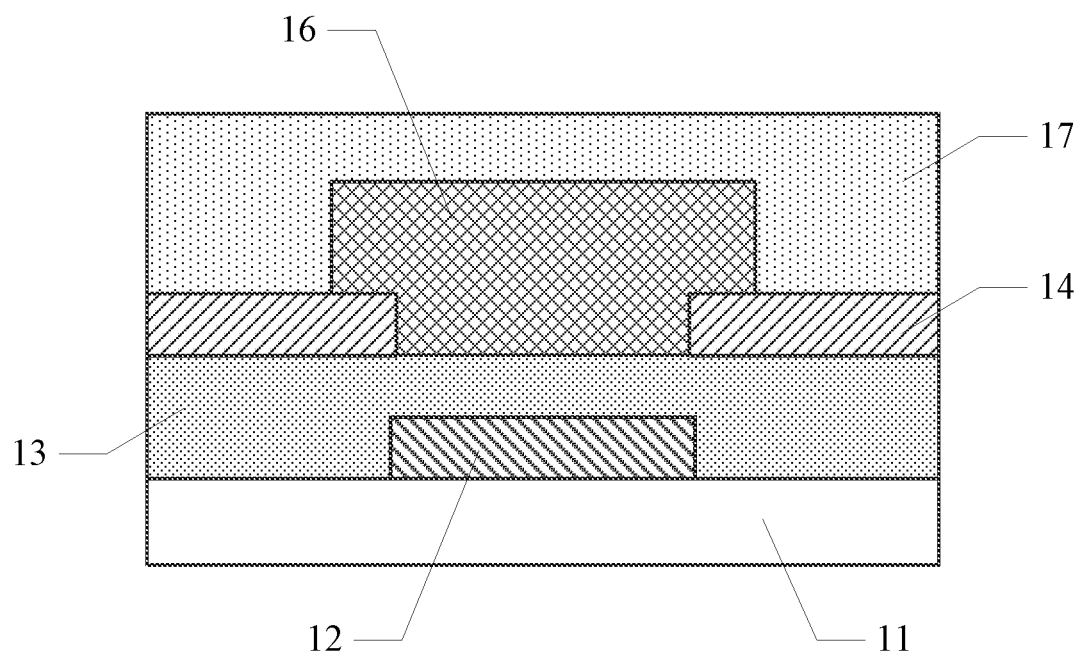
FIG. 10 is a schematic structural partial sectional view of the TFT provided by an embodiment of the present disclosure.

In an example of subsequent steps after the step S107, FIG. 10 is a schematic structural partial sectional view of the TFT provided by one embodiment of the present disclosure.

As illustrated in FIG. 10, in the embodiment of the present disclosure, on the basis of the structure as illustrated in FIG. 9, an entire passivation layer 17 is also formed. The passivation layer 17 may be made from an insulating material such as silicon oxide or silicon nitride and is mainly used to maintain the electrical insulation between conductive structures and taken as an overcoat (OC) layer for formed structures. In particular, when the source/drain pattern of the transistor must be electrically connected with the structures formed on the passivation layer 17, a second through hole (via hole) not shown in the accompanying drawing may be formed in the passivation layer 17 of the source/drain electrode setting area A1 by one patterning process on this basis. Thus, the electrical connection can be achieved by a conductive structure formed in the second through hole.

In another example of the subsequent steps after the step S107, after the process of removing the residual photoresist layer in the step S107, the following steps not shown in the accompanying drawings may also be included.

S108: forming a gate insulating layer for covering the source/drain metal layer and the active layer; and S109: forming a gate metal layer on the gate insulating layer by one patterning process, in which the gate metal layer includes a gate electrode pattern corresponding to the gate electrode setting area.

It should be understood that the step S109 may be achieved by the process similar to the step S201, and the step S108 may be achieved by the process similar to the step S202. On this basis, a TFT in a top-gate structure may be formed in the embodiment of the present disclosure. Of course, in any embodiment of the present disclosure, formed TFTs may simultaneously include those in a top-gate structure and those in a bottom-gate structure (namely a first gate metal layer and a second gate metal layer are respectively formed on both sides of the active layer), or formed TFTs may include only the TFTs in a top-gate structure (corresponding to the embodiment as illustrated by the steps 108 and 109) or include only the TFTs in a bottom-gate structure (corresponding to the embodiment as illustrated by the steps 201 and 202). No limitation will be given here in the present disclosure.

On the basis of same disclosure concept, the embodiment of the present disclosure provides an array substrate, which comprises TFTs manufactured by the method for manufacturing the TFT provided by any foregoing embodiment. Of course, the type, number, position and connection relationship of the TFTs in the array substrate are not limited in the embodiment of the present disclosure.

It should be understood that: compared with the prior art, in the array substrate, the surface of the source/drain metal layer has better interface characteristics (smoothness, resistance, etc), so the problem that the source/drain metal layer is prone to be damaged in the deposition process of the oxide semiconductor and the wet etching process of the acid liquor can be resolved, and the original macroscopic structure of the array substrate may be unchanged as the number of the patterning processes may also be not increased. Therefore, the display performance and the yield of products can be improved.

On the basis of same disclosure concept, the embodiment of the present disclosure provides a display device, which comprises any foregoing array substrate.

It should be noted that the display device provided by the embodiment may be: any product or component with display function such as a display panel, e-paper, a mobile phone, a tablet PC, a television set, a notebook computer, a digital picture frame and a navigator. As the display device comprises any foregoing array substrate, the display device provided by the embodiment of the present disclosure can solve corresponding technical problems and achieve corresponding technical effects. No further description will be given here.

As seen from the above, in the embodiment of the present disclosure, the photoresist layer provided with the completely retained region, the partially-retained region and the completely removed region is formed in the half-tone mask process in the patterning process of the source/drain metal layer. Thus, the patterning process of the source/drain metal layer may be completed by direct metal etching in the completely removed region; and subsequently, the photoresist layer which is only arranged in the completely retained region may be formed by removing the photoresist layer in the partially-retained region. Thus, the photoresist layer in the completely retained region can protect the source/drain metal layer from being damaged in the forming process of the active layer, and the exposed photoresist layer may be removed after the patterning process of the active layer is completed, so that the subsequent steps cannot be affected.

As can be seen, the embodiment of the present disclosure can resolve the problem that the source/drain metal layer is prone to be damaged in the deposition process of the oxide semiconductor and the wet etching process of the acid liquor, does not change the original macroscopic structure of the TFT as the number of the patterning processes is not required to be increased, and hence can improve the display performance and the yield of products.

Of course, any product or method provided by the embodiment of the present disclosure is not required to simultaneously have all the above advantages.

The application claims priority to the Chinese patent application No. 201610073575.5, filed Feb. 2, 2016, the disclosure of which is incorporated herein by reference as part of the application.

What is claimed is:

1. A method for manufacturing a thin-film transistor (TFT), comprising:
    forming a metal film on a substrate;
    forming a photoresist layer provided with a completely retained region, a partially-retained region and a completely removed region on the metal film by a half-tone mask process, in which at least a portion of the completely retained region corresponds to an area, not overlapped with an active region setting area, in a source/drain electrode setting area, the partially-retained region corresponds to an overlapped area between the source/drain electrode setting area and the active region setting area, and the completely removed region is an area outside the completely retained region and the partially-retained region;
    forming a source/drain metal layer corresponding to the completely retained region and the partially-retained region by etching the metal film under the cover of the photoresist layer, in which the source/drain metal layer includes a source/drain pattern corresponding to the source/drain electrode setting area;
    removing the photoresist layer in the partially-retained region;
    forming a semiconductor film for covering the substrate, the photoresist layer and the source/drain metal layer in the case where the source/drain metal layer in the completely retained region is covered by the photoresist layer;
    forming an active layer by patterning the semiconductor film, in which the active layer includes an active region pattern corresponding to the active region setting area; and
    removing residual photoresist layer.

2. The method for manufacturing the TFT according to claim 1, wherein the removing the photoresist layer in the partially-retained region includes:
    reducing a thickness for all the photoresist layer by an ashing process, so as to reduce the thickness of the photoresist layer in the completely retained region and remove the photoresist layer in the partially-retained region.

3. The method for manufacturing the TFT according to claim 1, wherein the removing the photoresist layer in the partially-retained region includes:
    performing exposure and development on the photoresist layer via a mask used in the half-tone mask process, so as to remove the photoresist layer in the partially-retained region when retaining the photoresist layer in the completely retained region simultaneously.

4. The method for manufacturing the TFT according to claim 1, wherein the forming the semiconductor film for covering the substrate, the photoresist layer and the source/drain metal layer in the case where the source/drain metal layer in the completely retained region is covered by the photoresist layer includes:
    forming the semiconductor film including a metal oxide semiconductor on the substrate, the photoresist layer and the source/drain metal layer via a deposition process of the metal oxide semiconductor.

5. The method for manufacturing the TFT according to claim 1, wherein the forming the active layer by patterning the semiconductor film includes:

forming the active layer by patterning the semiconductor film via a patterning process of a metal oxide semiconductor.

6. The method for manufacturing the TFT according to claim 1, wherein the removing the residual photoresist layer includes:
   entirely removing the photoresist layer by a stripping process.

7. The method for manufacturing the TFT according to claim 1, wherein before the forming the metal film on the substrate, the method further comprises:
   forming a gate metal layer on the substrate by one patterning process, in which the gate metal layer includes a gate electrode pattern corresponding to a gate electrode setting area; and
   forming a gate insulating layer for covering the substrate and the gate metal layer, so as to form the substrate.

8. The method for manufacturing the TFT according to claim 1, wherein after the removing the residual photoresist layer, the method further comprises:
   forming a gate insulating layer for covering the source/drain metal layer and the active layer; and
   forming a gate metal layer on the gate insulating layer by one patterning process, in which the gate metal layer includes a gate electrode pattern corresponding to a gate electrode setting area.

* * * * *